United States Patent
Stolan (10) Patent No.: US 7,205,916 B1
(45) Date of Patent: Apr. 17, 2007

(54) DIGITAL METHOD AND APPARATUS FOR RESOLVING SHAFT POSITION

(75) Inventor: John A. Stolan, San Jose, CA (US)

(73) Assignee: Alliant Techsystems Inc., Edina, MN (US)

(*) Notice: Subject to any disclaimer, the term of this patent is extended or adjusted under 35 U.S.C. 154(b) by 0 days.

(21) Appl. No.: 11/341,706

(22) Filed: Jan. 27, 2006

(51) Int. Cl.
H03M 1/48 (2006.01)

(52) U.S. Cl. .................. 341/111; 341/116; 318/661

(58) Field of Classification Search ............. 341/111, 341/116; 318/661, 700
See application file for complete search history.

(56) References Cited

U.S. PATENT DOCUMENTS

| | | | |
|---|---|---|---|
| 3,005,969 A | 10/1961 | Wysocki | |
| 3,041,874 A | 7/1962 | Saxi | 323/264 |
| 4,204,257 A * | 5/1980 | Hungerford | 700/195 |
| 4,599,560 A | 7/1986 | Sanford et al. | 324/201 |
| 4,847,548 A | 7/1989 | Lafler | 323/264 |
| 5,241,268 A | 8/1993 | Lee | |
| 5,327,030 A | 7/1994 | DeVito et al. | |
| 5,912,638 A | 6/1999 | Vlahu | |
| 6,084,376 A | 7/2000 | Piedl et al. | |
| 6,163,127 A * | 12/2000 | Patel et al. | 318/700 |
| 6,255,794 B1 | 7/2001 | Staebler | |
| 6,320,349 B1 * | 11/2001 | Kaneko et al. | 318/798 |
| 6,320,524 B1 * | 11/2001 | Takehara | 341/116 |
| 6,323,790 B1 * | 11/2001 | Takehara | 341/111 |
| 6,331,759 B1 | 12/2001 | Atmur | |
| 6,505,141 B2 | 1/2003 | Smith et al. | 717/100 |
| 6,694,287 B2 | 2/2004 | Mir et al. | |
| 6,754,610 B2 | 6/2004 | Dudler et al. | |
| 6,844,720 B1 | 1/2005 | Pokrywka | |
| 6,931,918 B2 | 8/2005 | Herb | |
| 7,015,840 B2 * | 3/2006 | Takehara | 341/116 |
| 2002/0135386 A1 | 9/2002 | Smith et al. | 324/683 |
| 2005/0027405 A1 | 2/2005 | Stockbridge et al. | |
| 2005/0035870 A1 | 2/2005 | Bauerle et al. | |
| 2005/0046593 A1 | 3/2005 | Tulpule et al. | |

FOREIGN PATENT DOCUMENTS

| | | |
|---|---|---|
| GB | 2 339 287 A | 1/2000 |
| WO | WO 93/22622 A1 | 11/1993 |
| WO | WO 2004/004111 A1 | 1/2004 |
| WO | WO 2005/022087 A2 | 3/2005 |

* cited by examiner

*Primary Examiner*—Peguy JeanPierre
(74) *Attorney, Agent, or Firm*—TraskBritt (57) ABSTRACT

An apparatus and method for determining an angular position of a shaft are disclosed, which comprise resolving an excitation signal at an excitation frequency into at least two orthogonal signals, converting the orthogonal signals to a digital estimate, for each of the orthogonal signals, and evaluating an amplitude and a polarity of the orthogonal signals to determine the angular position. The process of converting the orthogonal signals comprises comparing the orthogonal signal to an analog feedback signal to generate a comparison result and incrementally adjusting the digital estimate in response to sampling the comparison result at an estimation frequency. The converting process also includes converting the digital estimate to the analog feedback signal, collecting a digital estimate history at a sample frequency that is a binary multiple of the excitation frequency, and analyzing the digital estimate history to determine the amplitude and the polarity substantially near the excitation frequency.

38 Claims, 5 Drawing Sheets

DIGITAL METHOD AND APPARATUS FOR RESOLVING SHAFT POSITION

CROSS-REFERENCE TO RELATED APPLICATION

The present application is related to concurrently filed U.S. patent application Ser. No. 11/341,738, filed Jan. 27, 2006, and entitled DIGITAL METHOD AND APPARATUS FOR SENSING POSITION WITH A LINEAR VARIABLE DIFFERENTIAL TRANSFORMER.

BACKGROUND OF THE INVENTION

1. Field of the Invention

This invention relates generally to determining angular position and velocity of a shaft and, more particularly, to using digital means for determining angular position and velocity of a shaft.

2. Description of Related Art

This invention relates to determining angular position and velocity of a shaft by using the electrical outputs of a resolver. A resolver is a type of sensor for determining the rotational position of an axis or shaft, such as a motor shaft. Generally, resolvers have one rotor winding and two stator windings. The two stator windings are typically mechanically arranged so that they are orthogonal to each other (i.e., 90 degrees apart). This physical spacing creates an electrical relationship such that any signals induced in the stator windings from the rotor windings are 90 degrees apart. Since the windings are 90 degrees apart, the relative amplitude of the signals in the stator windings are sine and cosine functions corresponding to the shaft angle being measured. By measuring the amplitudes and taking the arctangent function, it is possible to derive the shaft angle.

These output signals from the two stator windings are generally analog signals, which may require a significant amount of analog electronics to evaluate the signal amplitudes and derive the shaft position. As a result, many proposals use analog-to-digital converters to convert the analog signals to digital signals, which may then be manipulated digitally to determine the respective amplitudes and calculate the trigonometric functions to determine the shaft position. However, even these solutions may require complex analog-to-digital converters, and complex arithmetic engines for determining the signal amplitudes.

There is a need for a method and apparatus that reduces the complexity and number of analog components used in determining angular position and velocity by using simple analog components coupled to flexible digital logic and digital signal processing.

BRIEF SUMMARY OF THE INVENTION

The present invention reduces the complexity and number of analog devices needed to resolve angular position and velocity of a shaft.

An embodiment of the present invention comprises an apparatus for determining an angular position of a shaft, which includes a resolver, a sine signal analyzer, a cosine signal analyzer, and a result calculator. The resolver includes an excitation input coupled to an excitation signal with an excitation frequency, a sine output coupled to an analog input of the sine analyzer, and a cosine output coupled to an analog input of the cosine analyzer. Each of the sine signal analyzer and the cosine signal analyzer includes a comparator, a digital estimator, a digital-to-analog converter, an amplitude analyzer, and a polarity checker. The comparator is configured for comparing the analog input to an analog feedback signal and generating a comparison result. The digital estimator uses the comparison result to modify a digital estimate by an incremental adjustment amount at an estimation frequency in response to the comparison result. The digital estimate is converted to the analog feedback signal by the digital-to-analog converter. The amplitude analyzer collects a digital estimate history at a sample frequency that is a binary multiple of the excitation frequency and determines an amplitude of the digital estimate substantially near the excitation frequency. Finally, the polarity checker determines the polarity of the digital estimate at the sample frequency. With the amplitude and polarity determined for each of the sine analyzer and the cosine analyzer, the result calculator evaluates the amplitude and the polarity for each of the sine signal analyzer and cosine signal analyzer to generate the angular position.

Another embodiment of the present invention comprises a method for determining an angular position of a shaft. The method comprises resolving an excitation signal at an excitation frequency into at least two orthogonal signals, converting the at least two orthogonal signals to a digital estimate for each of the orthogonal signals, and evaluating an amplitude and a polarity of the digital estimate of the orthogonal signals to determine the angular position. The process of converting the orthogonal signals comprises comparing the orthogonal signal to an analog feedback signal to generate a comparison result and incrementally adjusting the digital estimate in response to sampling the comparison result at an estimation frequency. The converting process also includes converting the digital estimate to the analog feedback signal, collecting a digital estimate history at a sample frequency that is a binary multiple of the excitation frequency, and analyzing the digital estimate history to determine the amplitude and the polarity of the digital estimate substantially near the excitation frequency.

Yet another embodiment, in accordance with the present invention, comprises a method of determining an angular position of a shaft. This method includes resolving an excitation signal at an excitation frequency into a sine signal and a cosine signal, converting the sine signal to a sine digital estimate, converting the cosine signal to a cosine digital estimate, evaluating a sine amplitude, a sine polarity, a cosine amplitude and a cosine polarity to determine the angular position. Converting the sine signal includes comparing the sine signal to a sine analog feedback signal to generate a sine comparison result. Converting the sine signal also includes incrementally adjusting the sine digital estimate in response to sampling the sine comparison result at an estimation frequency, converting the sine digital estimate to the sine analog feedback signal, and analyzing the sine digital estimate to determine the sine amplitude and the sine polarity of the sine signal substantially near the excitation frequency. Similarly, converting the cosine signal includes comparing the cosine signal to a cosine analog feedback signal to generate a cosine comparison result. Converting the cosine signal also includes incrementally adjusting the cosine digital estimate in response to sampling the cosine comparison result at the estimation frequency, converting the cosine digital estimate to the cosine analog feedback signal, and analyzing the cosine digital estimate to determine the cosine amplitude and the cosine polarity of the cosine signal substantially near the excitation frequency.

BRIEF DESCRIPTION OF THE DRAWINGS

In the drawings, which illustrate what is currently considered to be the best mode for carrying out the invention.

DETAILED DESCRIPTION OF THE INVENTION

The present invention reduces the complexity and number of analog devices needed to resolve angular position and velocity of a shaft.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations, and the like, have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Furthermore, signals may be referred to as asserted and negated. Those of ordinary skill in the art will recognize that in most instances, the selection of asserted or negated may be arbitrary and the invention could be implemented with the opposite states for such signals.

Figure 1:
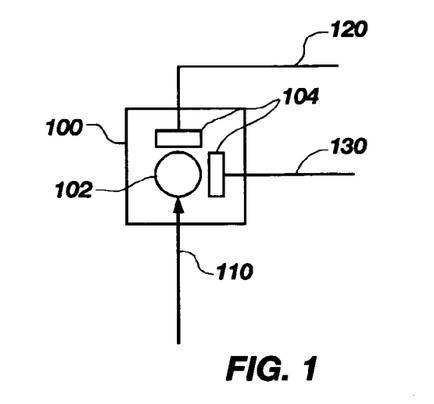
FIG. 1 is a schematic depiction of a resolver.

FIG. 1 illustrates a resolver 100. The resolver 100 includes an excitation input 110 attached to a rotor 102 and at least two stators 104 attached to modulation outputs (120 and 130). The stator 104 may be attached to a shaft (not shown). By way of example, and not limitation, the shaft may be a motor shaft, or shaft attached to a gear casing. In most cases, the stators 104 are configured physically such that they are orthogonal (i.e., at a 90 degree angle) to each other. Throughout this description, the modulation outputs (120 and 130) may also be referred to as orthogonal outputs or as a sine output 120 and a cosine output 130. The rotor 102 and stators 104 include windings such that when an electrical signal is induced in the rotor 102, inductive coupling produces electrical signals in the stator 104 windings. Since the stators 104 are positioned orthogonal to each other, the amount of inductive coupling to each stator 104 may be different and dependent on the position of the rotor 102.

Figure 2A:
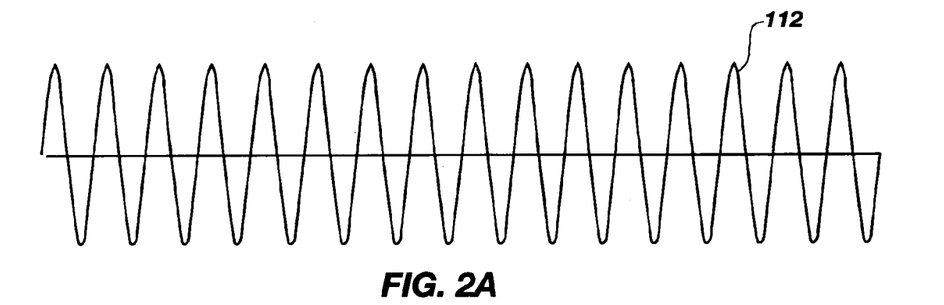
FIG. 2A illustrates a representative excitation waveform for input to a resolver.
Figure 2B:
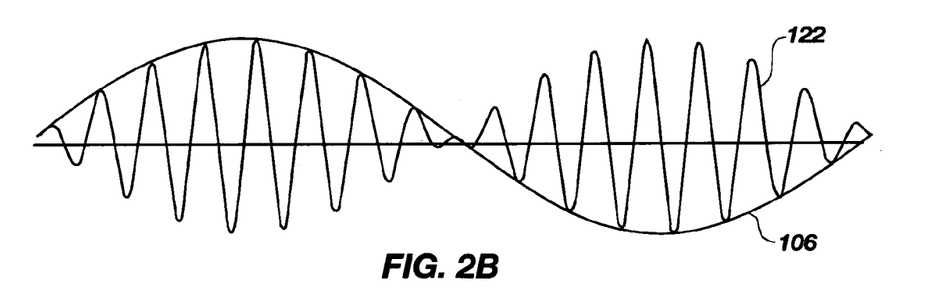
FIG. 2B illustrates a representative sine output waveform from a resolver when the excitation input is the excitation waveform of FIG. 2A and the resolver is rotating at a constant rate.
Figure 2C:
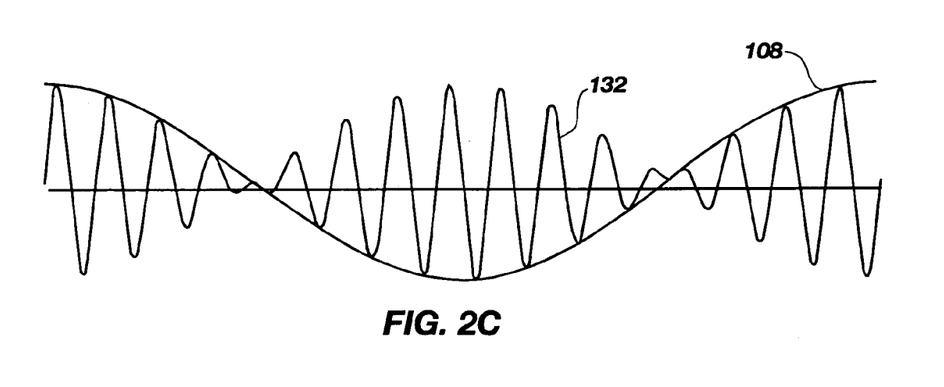
FIG. 2C illustrates a representative cosine output waveform from a resolver when the excitation input is the excitation waveform of FIG. 2A and the resolver is rotating at a constant rate.

By way of example, FIG. 2A illustrates an excitation signal 112 that may be applied to the excitation input 110 coupled to the rotor windings. In this example, the excitation signal 112 is a sinusoidal signal driven through the rotor windings, which inductively induces modulated sinusoidal signals in the orthogonal outputs (120 and 130). FIGS. 2B and 2C illustrate the modulation outputs that may be present when the rotor 102 is rotating at a substantially constant rate. A sine signal 122 on the sine output 120 includes a modulated amplitude that is modulated along a sine envelope 106 having a frequency substantially the same as the rotational frequency of the rotor 102. Similarly, a cosine signal 132 on the cosine output 130 includes a modulated amplitude 290 that is modulated along a cosine envelope 108 having a frequency substantially the same as the rotational frequency of the rotor 102. As the example in FIGS. 2A, 2B, and 2C illustrate, the excitation frequency should be substantially higher than the rotational frequency of the rotor 102 such that there are multiple periods of the excitation frequency for each rotational period. For example, the excitation signal 112 may have an excitation frequency generally in the range of about 1 to 10 kHz, but the scope of the invention is not limited to this range.

Figure 3:
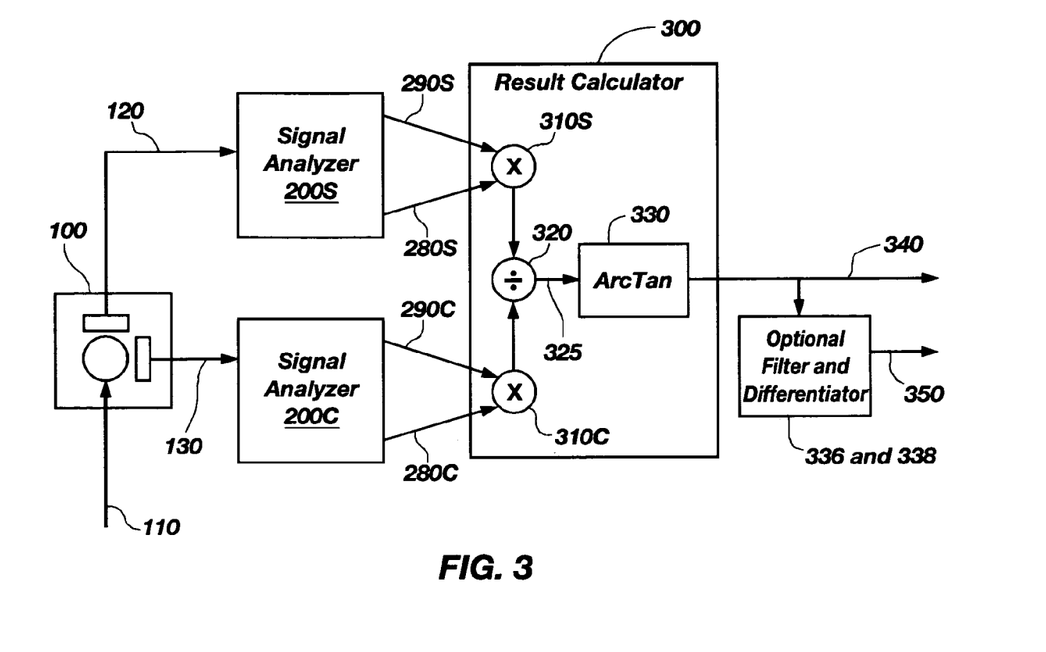
FIG. 3 is a schematic depiction of a representative embodiment of the present invention including a resolver.

FIG. 3 illustrates a representative embodiment of the present invention. The excitation input 110 couples to the rotor of the resolver 100. The stators of the resolver 100 are coupled to a sine output 120 and a cosine output 130. Each of the sine output 120 and the cosine output 130 are coupled to a signal analyzer (200S and 200C). Each signal analyzer (200S and 200C) generates a polarity (280S and 280C) and an amplitude (290S and 290C) for its respective input signal.

A result calculator 300 receives the outputs from the signal analyzers (200S and 200C) to calculate the angular position 340. The result calculator 300 may comprise an arithmetic unit configured for calculating the equation arctan ((PS*AS)/(PC*AC)), wherein PS represents the polarity 280S from the sine signal analyzer 200S, AS represents the amplitude 290S from the sine signal analyzer 200S, PC represents the polarity 280C from the cosine signal analyzer 200C, and AC represents the amplitude 290C from the cosine signal analyzer 200C.

The result calculator also may comprise dedicated circuitry for calculating the angular position as illustrated in FIG. 3. In FIG. 3, two simple sign multipliers (310S and 310C) are configured to multiply the amplitude (290S and 290C) of the signal by the polarity (280S and 290C) of the signal. Thus, the sine amplitude 290S is multiplied by the sine polarity 280S and the cosine amplitude 290C is multiplied by the cosine polarity 280C. A divider 320 divides the resultant sine by the resultant cosine to arrive at a tangent 325 of the shaft angle. An arctangent calculator 330 uses the tangent 325 to calculate the arctangent of the ratio between the sine and cosine to get the angular position 340 of the shaft. Various methods may be used for calculating the arctangent, such as, for example, a conventional Cordic method may be used to perform this task digitally.

The final result is a digital representation of the angular position 340. An optional filter 336 may be used to filter the angular position 340 with a conventional digital filtering algorithm to further reduce noise. The angular position 340 is sufficiently accurate and stable, that it can be differentiated to determine an estimate of the angular velocity 350. A differentiator 338 may simply sample the angular position 340 at adjacent time periods, find the difference between the sampled angular positions 340, and divide the difference by the time period between samples to arrive at an angular velocity 350 estimate. Of course, other more complex, and perhaps more accurate, differentiation methods are contemplated within the scope of the invention.

Figure 4:
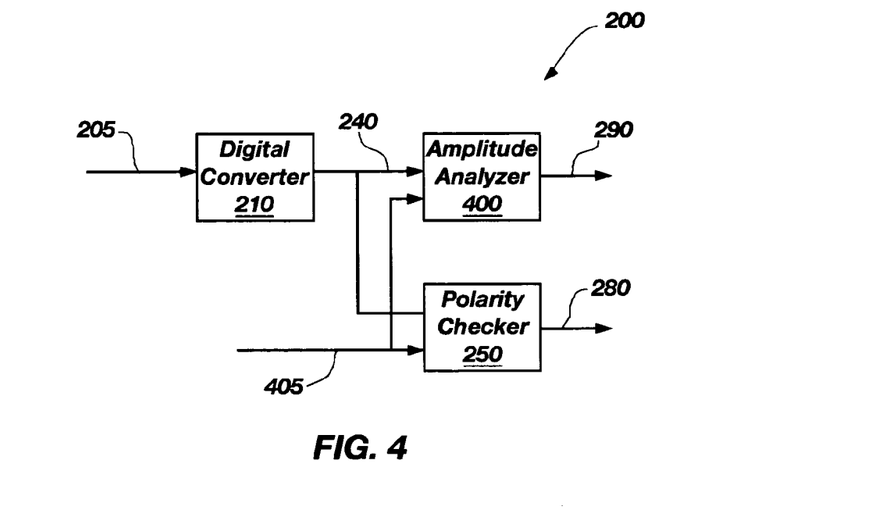
FIG. 4 is a schematic depiction of a representative embodiment of a signal analyzer according to the present invention.

FIG. 4 illustrates a representative embodiment of the signal analyzer 200. The signal analyzer 200 is the same for both the sine signal analyzer 200S and the cosine signal analyzer 200C. Thus, the sine output 120 and the cosine output 130 couple to the input signal 205 of their respective signal analyzers (200S and 200C). Similarly, the amplitude 290 and polarity 280 outputs from the signal analyzer (200S and 200C) couple to the corresponding amplitude 290 and polarity 280 outputs of the sine signal analyzer 200S and the cosine signal analyzer 200C.

In the signal analyzer 200, the input signal 205 couples to a digital converter 210, which converts the analog input signal to a digital estimate 240. The digital estimate 240 is used by an amplitude analyzer 400 to generate the amplitude of the input signal 205 and a polarity checker 250 to generate the polarity 280 of the input signal 205.

The polarity checker 250 repeatedly samples the digital estimate 240 using a sample clock 405 to determine whether the signal is negative or positive. The polarity of the sinusoidal signals coming from the stator windings is in relation to the rotor excitation. As the excitation reaches the peak of the sine wave, if the polarity matches the excitation then the stator has positive polarity, otherwise it is negative.

Similarly, the amplitude analyzer 400 repeatedly samples the digital estimate 240 using the sample clock 405 to create a digital estimate history, which may be used to convert the time varying digital estimate 240 from the time domain to the frequency domain. The output of the amplitude analyzer 400 is a digital signal indicating the amplitude 290 of the modulated signal substantially near the excitation frequency. In other words, the output of the sine amplitude analyzer is a digital value indicating the amplitude 290S of the sine output 120 substantially near the excitation frequency and the output of the cosine amplitude analyzer is a digital value indicating the amplitude 290C of the cosine output 130 substantially near the excitation frequency. The amplitude analyzer 400 is explained more fully below.

A digital converter 210 is used to provide a continuously available estimate of the input signal 205 accurate to within one bit. A continuously available estimate may be advantageous in that it does not have the sample and hold characteristics of many conventional analog-to-digital converters and may not need to be synchronized to other clocks within the system.

Figure 5:
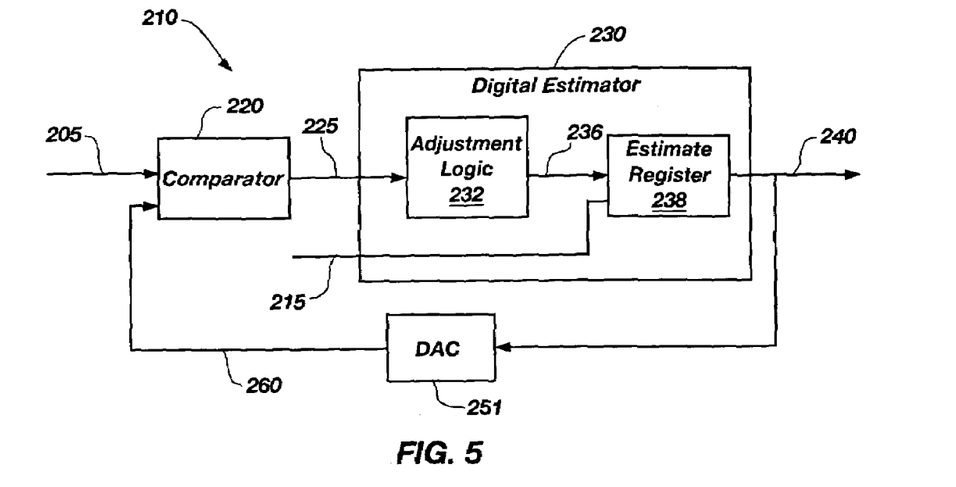
FIG. 5 is a schematic depiction of a representative embodiment of a digital converter according to the present invention.

Details of a representative embodiment of the digital converter 210 are illustrated in FIG. 5. In the digital converter 210, the input signal 205 couples to a simple fast analog comparator 220. The other input of the analog comparator 220 is coupled to an analog feedback signal 260.

The comparison result 225 is a digital signal that may be asserted if the input signal 205 is larger than the analog feedback signal 260 and negated if the input signal 205 is smaller than the analog feedback signal 260.

A digital estimator 230, which is controlled by an estimation clock 215, analyzes the comparison result 225 to update the digital estimate 240. The update rate at which the estimation clock 215 runs is selected such that the estimate will always be able to track the input signal 205. Thus, the estimation frequency may be a substantially higher frequency than the excitation frequency. For example, and not limitation, the estimation clock 215 may run at or above one mHz for an excitation frequency of about 10 kHz.

The digital converter 210 is a feedback loop that begins by selecting a starting digital estimate 240 of the signal amplitude, which is stored in an estimate register 238. The comparison result 225 is used by adjustment logic 232 to determine whether the digital estimate 240 should be improved by modifying the digital estimate 240 by an incremental adjustment amount. Thus, based on the comparison result 225, the adjustment logic 232 may generate an adjustment signal 236 for incrementing, decrementing, or maintaining the digital estimate 240. The resulting new digital estimate couples to a digital-to-analog converter 251, which generates the analog feedback signal 260 for comparison in the comparator 220. The feedback loop continues until the digital estimate 240 is an accurate representation of the input signal 205. Then, as the input signal 205 changes, the digital converter 210 can easily track the changes through the adjustment logic 232 and feedback loop.

For many applications, this method may be unacceptably slow. However, the present invention takes advantage of the A Priori knowledge that the input signal will be substantially a sinusoidal wave of known frequency and limited, but varying, amplitude. The update rate (i.e., the estimation frequency) is selected such that the estimate will always be able to accurately track the input signal. As a result, this method is faster than other conversion methods, provides an estimate accurate to within one bit, and provides an estimate that is continuously available to other circuitry in the system.

Figure 6:
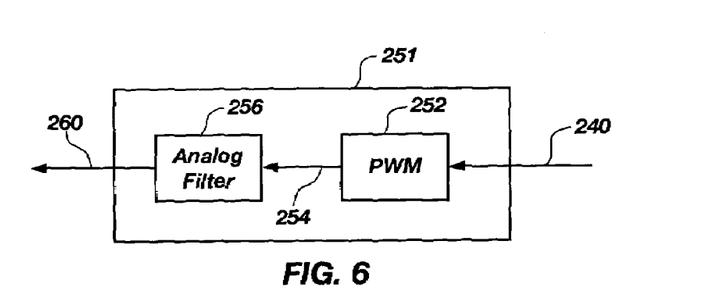
FIG. 6 is a schematic depiction of a representative embodiment of a digital-to-analog converter according to the present invention.

The digital-to-analog converter 251 may be implemented in a variety of ways known to those of ordinary skill in the art. One representative embodiment of the digital-to-analog converter 251 that may be simple to implement is illustrated in FIG. 6. The digital estimate 240 is used by a pulse-width modulator 252 (PWM), which converts the digital estimate 240 into a pulse-width modulated estimate 254, which is a series of pulses with varying duty cycles corresponding to the digital estimate values. An analog filter 256 filters the pulse-width modulated estimate 254 to generate the analog feedback signal 260 to represent variations in the digital estimate 240.

Figure 7A:
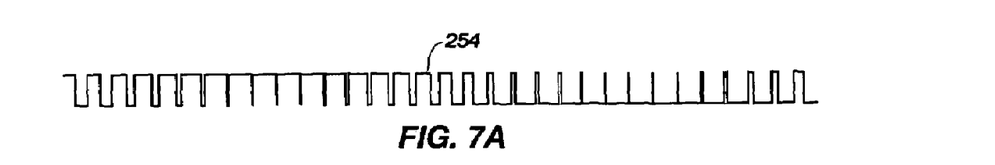
FIG. 7A illustrates a representative pulse width modulation signal for generating a sine wave.

FIG. 7A illustrates an example pulse-width modulated estimate 254. The width of the pulses (i.e., the duty cycle) is varied in proportion to the magnitude of the digital estimate to generate the pulse train with varying pulse widths. As a result, the pulse-width modulated estimate 254 includes a varying amount of energy, which corresponds to the high portion of the pulses. Therefore, the pulse-width modulated estimate 254 may be filtered by a simple low pass analog filter 256 to generate the analog feedback signal 260 (shown as signal plot 285 in FIG. 7B).

Figure 8:
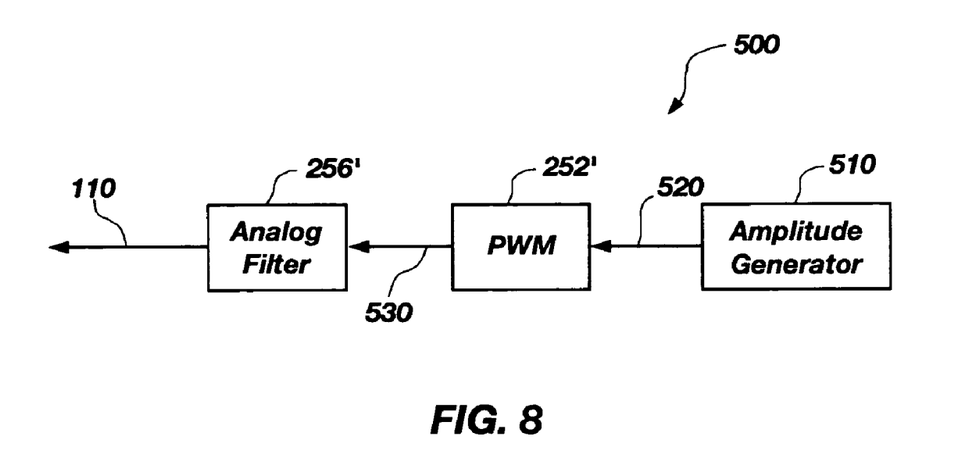
FIG. 8 is a schematic depiction of a representative embodiment of an excitation signal generator according to the present invention.

Returning to FIG. 3, the excitation input 110 may be configured as a sine wave with an excitation frequency. A simple excitation generator 500 may be used for generating the excitation input 110, as illustrated in FIG. 8. An amplitude generator 510 creates a digital excitation signal 520 with values that may vary for each clock cycle of a generation frequency. The generation frequency need only be fast enough to generate a substantially smooth sine wave after filtering. The digital excitation signal 520 is used by a PWM 252', which converts the digital excitation signal 520 into a pulse-width modulated signal 530. An analog filter 256' filters the pulse-width modulated signal 530 to generate the excitation input 110.

Figure 7B:
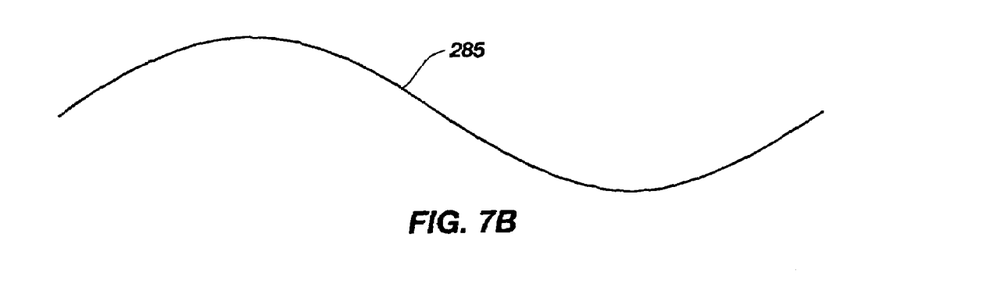
FIG. 7B illustrates a sine wave that may be produced by low pass filtering the pulse width modulation signal of FIG. 7A.

The function of the amplitude generator 510 including the pulse-width modulator 252' and analog filter 256' is similar to what was described for the digital-to-analog converter 251 of FIGS. 6, 7A and 7B. However, for the excitation generator 500 the amplitude generator 510 creates the desired signal. Thus, in FIG. 8 the amplitude generator 510 creates a digital excitation signal 520, which is a time varying digital representation for emulating a sine wave. The amplitude generator 510 may be some type of arithmetic unit for calculating sine waves, or it may be a simple look-up table with the proper amplitudes for generating a sine wave.

Returning to FIG. 4, the amplitude analyzer 400 converts the time varying digital estimate 240 from the time domain to the frequency domain. Generally, converting a time domain signal to the frequency domain generates a function with amplitudes at a variety of frequencies. The output of the amplitude analyzer 400 is a digital signal indicating the amplitude 290 of the modulated signal substantially near the excitation frequency. A number of implementation for finding the amplitude 290 of the modulated signal substantially near the excitation frequency may be used, such as, for example, implementing a conventional Fast Fourier Transform (FFT). However, a simpler implementation may be used for the present invention because only the amplitude 290 at the excitation frequency is needed.

Figure 9:
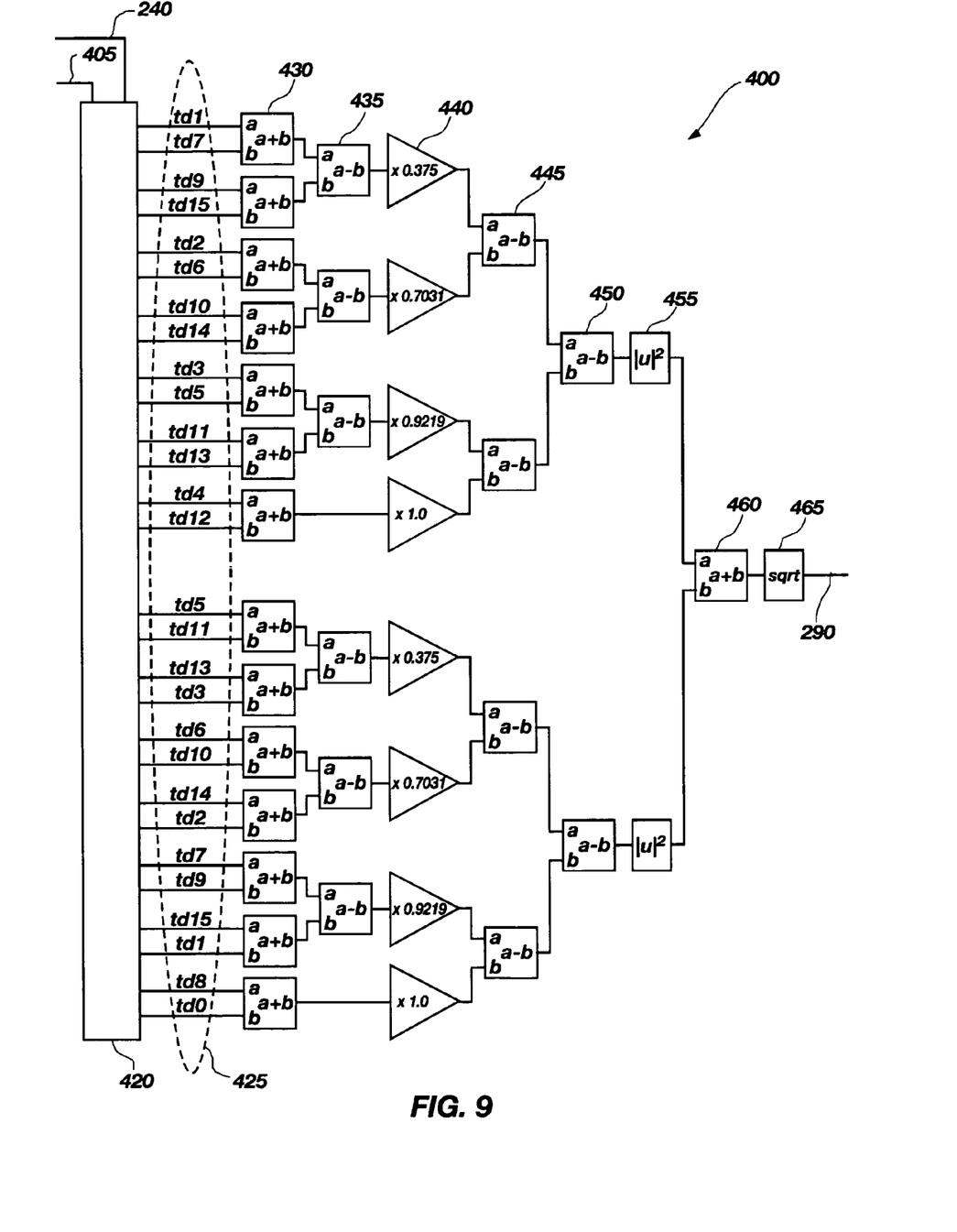
FIG. 9 is a schematic depiction of a representative embodiment of an amplitude analyzer according to the present invention.

FIG. 9 illustrates an implementation of an amplitude analyzer 400. A sample clock 405 running at a sample frequency feeds a history shift register 420 configured to sample and shift values of the digital estimate 240. Thus, the history shift register 420 generates a digital estimate history (425) N bits long.

The digital estimate history 425 is coupled to a set of summing units 430 in a butterfly pattern recognizable to those of ordinary skill in the art in performing a Discrete Fourier Transform (DFT), except that only the calculations necessary to determine the amplitude at the excitation frequency are performed. A first set of difference units 435 perform subtractions on the results from the first set of summing units 430. A set of multipliers 440 multiply the subtraction results from the first set of difference units 435 by the appropriate constants for a DFT. A second set of difference units 445 perform subtractions on the results from the set of multipliers 440. A third set of difference units 450 perform subtractions on the results from the second set of difference units 445. A set of squaring units 455 square the absolute value of the results from the third set of difference units 450. A summing unit 460 adds the results from the set of squaring units 455, and a square root unit 465 calculates the square root of the result from the summing unit 460 to arrive at the final amplitude 290.

The number of bits N in the digital estimate history 425 may be chosen to be a binary multiple. In the example of FIG. 9, the number of bits is chosen as 16 to generate the digital estimate history 425 of signals td0–td15. In addition, the sample frequency of the sample clock 405 is chosen to correspond to the number of bits such that the sample frequency is a binary multiple of the excitation frequency. Thus, in the example of FIG. 9, the sample frequency is set at 16 times the excitation frequency such that digital estimate history 425 comprises samples of one full cycle of the excitation frequency.

In operation, the implementation of FIG. 9 performs a limited DFT in that it only calculates the amplitude at the excitation frequency. For each sample point, the limited DFT is taken to provide the instantaneous amplitude of the input signal at the base excitation frequency. As each sample is taken, the new value is operated on along with the previous 15 samples using the limited DFT.

Those of ordinary skill in the art will recognize that embodiments of the amplitude analyzer 400 may encompass other bit widths and sample rates for the limited DFT. For example, and not limitation, the limited DFT may use a sample frequency that is of $2^N$ times the sample frequency wherein N may be in a range from 2 to 10. In addition, as stated earlier, the amplitude analyzer 400 also encompasses implementations that perform a full DFT or FFT to determine the amplitude of the digital estimate at the excitation frequency.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. An apparatus for determining an angular position of a shaft using a resolver coupled to the shaft, the resolver including an excitation input, a sine output, and a cosine output, the apparatus comprising:

a sine signal analyzer including an analog input operably coupled to the sine output and a cosine signal analyzer including an analog input operably coupled to the cosine output, each of the sine signal analyzer and the cosine signal analyzer comprising:

a comparator configured for comparing the analog input to an analog feedback signal and generating a comparison result;

a digital estimator configured to sample the comparison result and modify a digital estimate by an incremental adjustment amount responsive to the comparison result at an estimation frequency;

a digital-to-analog converter configured to convert the digital estimate to the analog feedback signal;

an amplitude analyzer configured to collect a digital estimate history at a sample frequency that is a binary multiple of an excitation frequency of the excitation input and determine an amplitude of the digital estimate substantially near the excitation frequency; and a polarity checker configured to determine a polarity of the digital estimate at the sample frequency; and a result calculator configured to evaluate the amplitude and the polarity of the sine signal analyzer and the amplitude and the polarity of the cosine signal analyzer to generate the angular position.

2. The apparatus of claim 1, further comprising a digital filter configured for filtering the angular position to generate a filtered angular position.

3. The apparatus of claim 1, further comprising a differentiator configured for differentiating the angular position to generate an angular velocity.

4. The apparatus of claim 3, further comprising a digital filter configured for filtering the angular position to generate a filtered angular position.

5. The apparatus of claim 1, further comprising an excitation generator configured for generating an excitation signal operably coupled to the excitation input as substantially a sine wave at the excitation frequency.

6. The apparatus of claim 5, wherein the excitation generator comprises:
an amplitude generator configured for generating a digital representation of the excitation signal at each time period of a generation frequency;
a pulse-width modulator configured for converting the digital representation to a digital pulse with a duty cycle correlated to the digital representation to generate a pulse-width modulated signal; and
a low pass filter configured for filtering the pulse-width modulated signal to generate the excitation signal.

7. The apparatus of claim 6, wherein the value generator is selected from the group consisting of a look-up table and a trigonometric calculator.

8. The apparatus of claim 1, wherein the result calculator comprises an arithmetic unit configured for calculating the equation arctan ((PS*AS)/(PC*AC)), wherein PS represents the polarity from the sine signal analyzer, AS represents the amplitude from the sine signal analyzer, PC represents the polarity from the cosine signal analyzer, and AC represents the amplitude from the cosine signal analyzer.

9. The apparatus of claim 1, wherein the result calculator comprises:
a first sign multiplier configured for multiplying the amplitude and the polarity of the sine signal analyzer to generate a sine estimate;
a second sign multiplier element configured for multiplying the amplitude and the polarity of the cosine signal analyzer to generate a cosine estimate;
a divider configured for dividing the sine estimate by the cosine estimate to generate a tangent; and
an arctangent calculator configured for calculating the arctangent from the tangent to generate the angular position.

10. The apparatus of claim 1, wherein the digital-to-analog converter comprises:
a pulse-width modulator configured for converting the digital estimate to a digital pulse with a duty cycle correlated to the digital estimate to generate a pulse-width modulated estimate; and
a low pass filter configured for filtering the pulse-width modulated estimate to generate the analog feedback signal.

11. The apparatus of claim 1, wherein the incremental adjustment amount is selected from the group consisting of no change, a positive increment, and a negative increment.

12. The apparatus of claim 1, wherein the binary multiple for the sample frequency is at a frequency of $2^N$ times the sample frequency wherein N is in a range from 2 to 10.

13. The apparatus of claim 1, wherein the amplitude analyzer further comprises a frequency analyzer configured for determining the amplitude of the digital estimate substantially near the excitation frequency by performing an operation selected from the group consisting of a fast Fourier transform, a, discrete Fourier transform and a limited discrete Fourier transform.

14. A method for determining an angular position of a shaft using a resolver coupled to the shaft, the resolver including an excitation input and at least two orthogonal signals, the method comprising:
converting the at least two orthogonal signals to a digital estimate, for each of the at least two orthogonal signals, the converting comprising:
comparing the orthogonal signal to an analog feedback signal to generate a comparison result;
incrementally adjusting the digital estimate in response to sampling the comparison result at an estimation frequency;
converting the digital estimate to the analog feedback signal;
collecting a digital estimate history at a sample frequency that is a binary multiple of an excitation frequency of the excitation input; and
analyzing the digital estimate history to determine an amplitude and a polarity of the digital estimate substantially near the excitation frequency; and
evaluating the amplitude and the polarity of the at least two orthogonal signals to determine the angular position.

15. The method of claim 14, further comprising digitally filtering the angular position to generate a filtered angular position.

16. The method of claim 14, further comprising differentiating the angular position to generate an angular velocity.

17. The method of claim 16, further comprising digitally filtering the angular position to generate a filtered angular position.

18. The method of claim 14, further comprising generating an excitation signal for the excitation input as substantially a sine wave at the excitation frequency.

19. The method of claim 18, wherein generating the excitation signal comprises:
generating a digital representation of the excitation signal at each time period of a generation frequency;
converting the digital representation to a digital pulse with a duty cycle correlated to the digital representation to generate a pulse-width modulated signal; and
filtering the pulse-width modulated signal to generate the excitation signal.

20. The method of claim 19, wherein generating a digital representation is a process selected from the group consisting of calculating the digital representation and retrieving the digital representation from a look-up table.

21. The method of claim 14, wherein evaluating the amplitude and the polarity of the at least two orthogonal signals comprises calculating the equation arctan ((PS*AS)/(PC*AC)), wherein PS represents the polarity of a first of the at least two orthogonal signals, AS represents the amplitude of the first of the at least two orthogonal signals, PC represents the polarity of a second of the at least two orthogonal signals, and AC represents the amplitude of the second of the at least two orthogonal signals.

22. The method of claim 14, wherein converting the digital estimate to the analog feedback signal comprises:
converting the digital estimate to a digital pulse with a duty cycle correlated to the digital estimate to generate a pulse-width modulated estimate; and
filtering the pulse-width modulated estimate to generate the analog feedback signal.

23. The method of claim 14, wherein incrementally adjusting the digital estimate is a process selected from the group consisting of no change, a positive increment, and a negative increment.

24. The method of claim 14, wherein the binary multiple for the sample frequency is at a frequency of $2^N$ times the sample frequency wherein N is in a range from 2 to 10.

25. The method of claim 14, wherein analyzing the digital estimate history to determine the amplitude comprises performing an operation selected from the group consisting of a fast Fourier transform, a discrete Fourier transform, and a limited discrete Fourier transform.

26. A method for determining an angular position of a shaft, the method comprising:
resolving an excitation signal at an excitation frequency into a sine signal and a cosine signal;
converting the sine signal to a sine digital estimate, the converting comprising:
comparing the sine signal to a sine analog feedback signal to generate a sine comparison result;
incrementally adjusting the sine digital estimate in response to sampling the sine comparison result at an estimation frequency;
converting the sine digital estimate to the sine analog feedback signal; and
analyzing the sine digital estimate to determine a sine amplitude and a sine polarity of the sine signal substantially near the excitation frequency;
converting the cosine signal to a cosine digital estimate, the converting comprising:
comparing the cosine signal to a cosine analog feedback signal to generate a cosine comparison result;
incrementally adjusting the cosine digital estimate in response to sampling the cosine comparison result at the estimation frequency;
converting the cosine digital estimate to the cosine analog feedback signal; and
analyzing the cosine digital estimate to determine a cosine amplitude and a cosine polarity of the cosine signal substantially near the excitation frequency; and
evaluating the sine amplitude, the sine polarity, the cosine amplitude and the cosine polarity to determine the angular position.

27. The method of claim 26, further comprising digitally filtering the angular position to generate a filtered angular position.

28. The method of claim 26, further comprising differentiating the angular position to generate an angular velocity.

29. The method of claim 28, further comprising digitally filtering the angular position to generate a filtered angular position.

30. The method of claim 26, further comprising generating the excitation signal as substantially a sine wave at the excitation frequency.

31. The method of claim 30, wherein generating the excitation signal comprises:
generating a digital representation of the excitation signal at each time period of a generation frequency;
converting the digital representation to a digital pulse with a duty cycle correlated to the digital representation to generate a pulse-width modulated signal; and
filtering the pulse-width modulated signal to generate the excitation signal.

32. The method of claim 31, wherein generating the digital representation is a process selected from the group consisting of calculating the digital representation and retrieving the digital representation from a look-up table.

33. The method of claim 26, wherein evaluating the sine amplitude, the sine polarity, the cosine amplitude and the cosine polarity comprises:
multiplying the sine amplitude and the sine polarity to generate a sine estimate;
multiplying the cosine amplitude and the cosine polarity to generate a cosine estimate;
dividing the sine estimate by the cosine estimate to generate a tangent; and
calculating an arctangent from the tangent to generate the angular position.

34. The method of claim 26, wherein converting the digital estimate to the analog feedback signal comprises:
converting the digital estimate to a digital pulse with a duty cycle correlated to the digital estimate to generate a pulse-width modulated estimate; and
filtering the pulse-width modulated estimate to generate the analog feedback signal.

35. The method of claim 26, wherein incrementally adjusting the sine digital estimate and incrementally adjusting the cosine digital estimate are processes selected from the group consisting of no change, a positive increment, and a negative increment.

36. The method of claim 26, wherein:
analyzing the sine digital estimate comprises:
collecting a sine digital estimate history at a sample frequency that is a binary multiple of the excitation frequency of the excitation signal; and
analyzing the sine digital estimate history to determine the sine amplitude; and
analyzing the cosine digital estimate comprises:
collecting a cosine digital estimate history at the sample frequency that is the binary multiple of the excitation frequency of the excitation signal; and
analyzing the cosine digital estimate history to determine the cosine amplitude.

37. The method of claim 36, wherein the binary multiple for the sample frequency is at a frequency of $2^N$ times the sample frequency wherein N is in a range from 2 to 10.

38. The method of claim 26, wherein analyzing the sine digital estimate and analyzing the cosine digital estimate each comprises performing an operation selected from the group consisting of a fast Fourier transform, a, discrete Fourier transform and a limited discrete Fourier transform.

* * * * *